United States Patent [19]

Salathe et al.

[11] 4,335,362

[45] Jun. 15, 1982

[54] SEMICONDUCTOR DEVICE AND A METHOD OF CONTACTING A PARTIAL REGION OF A SEMICONDUCTOR SURFACE

[75] Inventors: René P. Salathé, Bern; E. Gerhard Badertscher, Bolligen; Willy A. R. Lüthy, Köniz, all of Switzerland

[73] Assignee: Institut fur Angewandte Physik der Universitat Bern, Bern, Switzerland

[21] Appl. No.: 94,236

[22] Filed: Nov. 14, 1979

[30] Foreign Application Priority Data

Nov. 17, 1978 [CH] Switzerland ............ 11827/78

[51] Int. Cl.³ ............................................ H01S 3/19
[52] U.S. Cl. .................................. 372/46; 29/569 L; 29/590; 219/121 L; 357/65; 357/67; 357/81
[58] Field of Search .................. 331/94.5 H; 357/65, 357/67, 71, 81, 17, 18; 219/121 L, 121 LC, 121 LD, 121 LE, 121 LM; 29/569 L, 590

[56] References Cited

U.S. PATENT DOCUMENTS

| | | | |
|---|---|---|---|
| 4,151,008 | 4/1979 | Kirkpatrick | 219/121 LM |
| 4,159,414 | 6/1979 | Suh et al. | 219/121 LM |
| 4,212,900 | 7/1980 | Serlin | 219/121 LF |
| 4,238,764 | 12/1980 | Carballes et al. | 357/65 |

OTHER PUBLICATIONS

Margalit et al., "Q-Switched Ruby Laser Alloying of Ohmic Contacts on Gallium Arsenide Epilayers", Appl. Phys. Lett. 33(4), Aug. 15, 1978, pp. 346-347.

*Primary Examiner*—James W. Davie
*Attorney, Agent, or Firm*—Brady, O'Boyle & Gates

[57] ABSTRACT

A semiconductor device comprising, a plurality of semiconductor layers having an outer semiconductor layer, and a contact layer uniformly and entirely covering said outer semiconductive layer and having over its entire surface the same material composition and abutting over its entire surface directly against said outer semiconductive layer but having only on a partial region of its surface a conductive transition to said outer semiconductive layer. The conductive transition being obtained by alloying said partial region by means of a focused laser beam pulse heating only said partial region of the contact layer to the alloying temperature, whereby alloy constituents of the melted contact material wetting said outer semiconductive layer diffuse only in a superficial zone of said outer semiconductive layer.

5 Claims, 3 Drawing Figures

SEMICONDUCTOR DEVICE AND A METHOD OF CONTACTING A PARTIAL REGION OF A SEMICONDUCTOR SURFACE

FIELD OF THE INVENTION

This invention relates to a semiconductor device having a contact layer which abuts, over its entire surface, against its semiconductor substrate, but has only on a partial region of its surface a conductive transition to the semiconductor substrate. The invention also relates to a method of contacting a partial region of a semiconductor surface, in which a contact layer is applied directly to the entire semiconductor surface.

A contact layer, having only on a partial region of its surface a conductive transition to the semiconductor substrate, of the semiconductor component, means whose bulk resistance between the partial region and the semiconductor substrate is small compared with that between the rest of the region of the surface and the semiconductor substrate. The contact layer may, for example, consist of one or more metals or semiconductor materials and possibly dopping substances.

A partial region of a surface means one or more—not necessarily coherent—surface parts, in which the sum of the surfaces forming the partial region is a fraction of the entire surface.

DESCRIPTION OF THE PRIOR ART

A semiconductor device of this kind is the stripe-geometry laser diode produced by proton bombardment (see, for example, J. C. Dyment, et al., "Proton-Bombardment Formation of Stripe-Geometry Heterostructure Lasers for 300 K CW Operation", Proc. IEEE 60, 726–728). This has, on the p-side and the n-side, respective metallic layers, covering the surface thereof, for connection to electrodes. The metallic layer on the n-side has on its entire surface, and that on the p-side has only on a striped partial region of its surface, a conductive transition to the semiconductor substrate. Upon the contacting of the laser diode, in the past the two metallic layers have been alloyed in an alloying furnace with their semiconductor substrates, whereby both metal layers were given, over their entire surface, a conductive transition to their semiconductor substrates. Then, a strip-form partial region of the metal layer alloyed with the p-layer was covered with a metal wire and the metal layer bombarded with protons. The proton bombardment was so dosed that in the semiconductor substrate of the metal layer not covered by the wire crystal defects were produced and in this way the conductivity thereof was severely reduced. After the proton bombardment, then only the strip-shaped partial region, which has been protected by the wire, of the metal layer had a conductive transition to the semiconductor substrate. The proton bombardment is complicated and expensive and has, moreover, the disadvantage that crystal defects are produced in the semiconductor layer. What is particularly disadvantageous is, furthermore, the fact that the depth of penetration of the protons has to be controlled very exactly, since otherwise either the active zone of the diode is damaged or the conductivity in that region which is covered by the wire is reduced only insufficiently.

Furthermore, various other contacting arrangements for stripe-geometry laser diodes are known. For example, onto the p-layer, first of all an insulating layer (of $SiO_2$) was applied, whereupon this was etched away in a strip-shaped partial region and only then was the metal layer applied and alloyed. Furthermore, the metal layer was first of all applied to the entire surface of the p-layer and alloyed, whereupon it was removed once more by means of a masking and etching process save for a strip-shaped part. These known contacting methods, too, are exceptionally complicated (or expensive), since several operations are always necessary.

SUMMARY OF THE INVENTION

The problem underlying the invention is to simplify the contacting of semiconductor components of the kind mentioned at the introduction hereto, more especially of stripe-geometry laser diodes, and to avoid the formation of crystal defects in the semiconductor material.

To achieve the solution, the invention provides, as a first feature, a semiconductor device having a contact layer which abuts, over its entire surface, directly against its semiconductor substrate, but has only on a partial region of its surface a conductive transition to the semiconductor substrate, characterized in that the contact layer is alloyed only in the partial region with the semiconductor substrate.

The invention will be described further, by way of example, with reference to the accompanying drawing which illustrates two exemplified embodiments of the semiconductor component in accordance with the invention and one example of a method, in accordance with the invention, for contacting a partial region of a semiconductor surface.

DESCRIPTION OF THE PREFERRED EMBODIMENT

Figure 1:
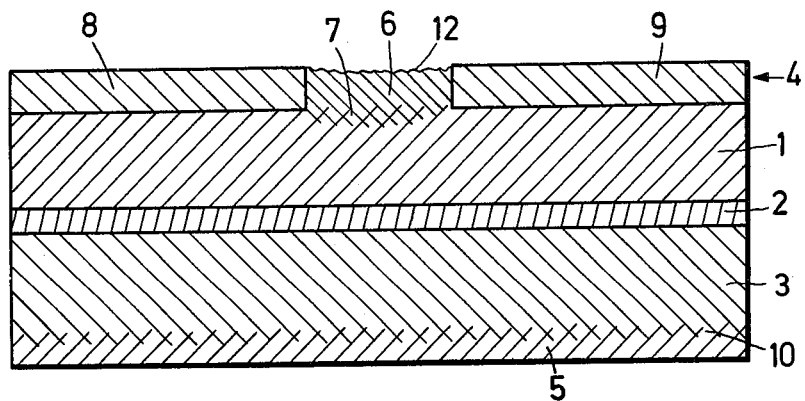
FIG. 1 is a highly-enlarged cross-section through a stripe-geometry laser diode having contact layers according to a first embodiment of the invention.

The stripe-geometry laser diode shown in FIG. 1 is a GaAlAs double hetero structure with a p-$Ga_{0.9}Al_{0.1}As$ layer 1, as p-GaAs layer 2 and an n-layer 3 consisting of an n-$Ga_{0.9}Al_{0.1}As$ layer and an n-GaAs layer. Mounted onto the p-layer 1 and the n-layer 3 are metal contact layers 4 and 5 respectively, which are approximately 0.5 to 1 micrometer thick. The contact layer 4 on the p-side contains gold as the main constituent and a percentage of zinc as a doping substance. It is alloyed only in a strip-shaped partial region 6 with the p-layer 1. The strip 6, which is approximately 10 micrometers wide, extends over the entire diode length of approximately 300 micrometers. The alloyed strip 6 has a conductive transitional zone 7 to the p-layer 1. The zone 7 forms a so-called ohmic metal-semiconductor contact or a so-called degenerate Schottky contact, which, as a result of the alloying, constituents alloyed in the region of the zone 7 into the p-layer 1 and the thereby highly increasing doping of the p-layer, has a purely ohmic resistance (without any rectifying effect). The remaining parts 8 and 9 of the metal layer 4, which extend from the strip 6 as far as the sides of the diode, are not alloyed with the p-layer 1, so that the contact resistance at the transition between the region 8, 9 and the p-layer 1 is exceptionally high and amounts to approximately a hundred times that at the transition of the strip 6. The layer 4 thus has a conductive transition to the p-layer 1 only at the strip 6. The metal layer 5 at the n-side consists of a gold/tin mixture which is alloyed over the entire surface with the n-layer 3, in other words it has over the entire surface a conductive transitional zone 10 to the n-layer 3.

Figure 2:
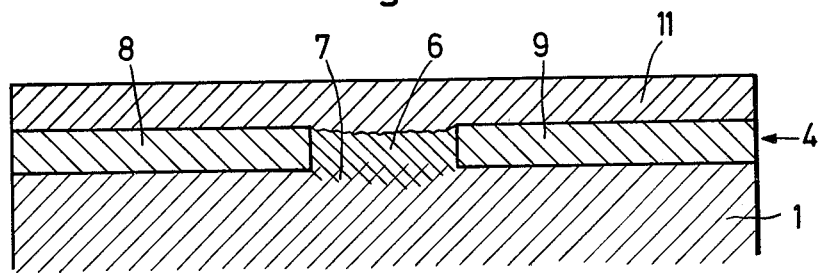
FIG. 2 is a view comparable with FIG. 1, but showing a modification of the contact layer on the p-side of the laser diode of FIG. 1.

In the case of the modification shown in FIG. 2, the layer 4 is coated with a second metal layer 11, for example of gold, which fills up the slight depressions 12 which have arisen in the layer 4 upon the alloying of the strip 6, and has a smooth flat surface. This is advantageous insofar as the conductivity in the transverse direction and the transfer resistance between alloyed region and electrode can thus be improved. Moreover, in this way the soldering-on of a contact wire or the soldering-on of the contact layer onto a heat sink can be facilitated.

The metallic layers 4, 5 may also be composed differently. For example, the layer 4 may consist of aluminium or a gold/indium or gold/chrome mixture.

Figure 3:
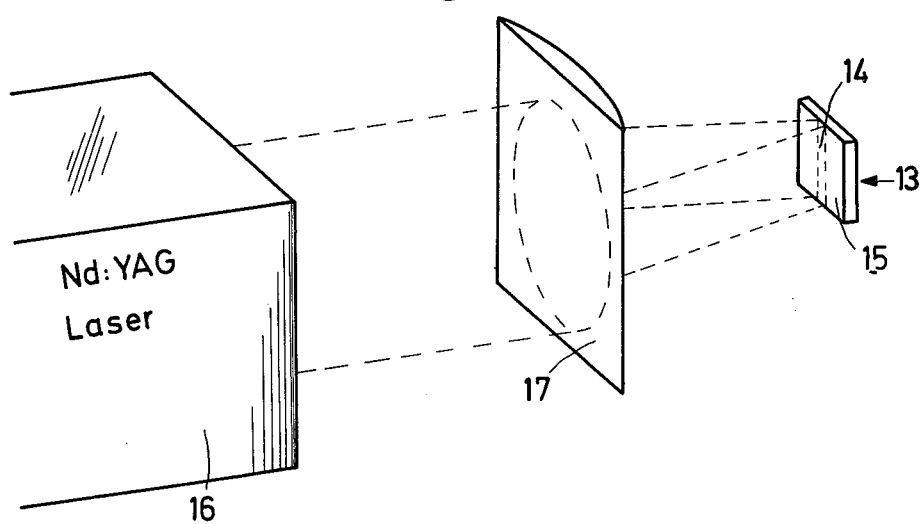
FIG. 3 is a schematic, perspective view illustrating a device used for contacting a stripe of a semiconductor surface.

The method of contacting a partial region of a semiconductor surface will be explained hereinunder by the example of the contacting of a GaAlAs platelet 13 (FIG. 3) for a laser diode of the kind shown in FIG. 1: In a first step of the method, a respective metal layer is applied to the p-layer and the n-layer of the platelet 13, by, in each case, first of all a layer of gold, then a layer of zinc (on the p-side), a layer of tin respectively (on the n-side) and finally once more a layer of gold being deposited by evaporation, the thickness of the first two layers being several tens nm, and that the last layer being some hundreds nm. Then, by means of the device shown in FIG. 3, a strip-shaped region 14 of the metal layer 15 is alloyed onto the p-side of the platelet 13. The device consists of a "q-Switch"-Nd:YAG laser 16 and a planoconvex cylindric lens 17 which focuses the laser beam pulse onto the strip-shaped region 14 of the layer 15. The pulse intensity and the pulse duration is on the one hand so great that the gold and zinc in the strip 14 of the layer 15 melts together and alloys with the p-layer, gold and zinc atoms diffusing into the p-layer. On the other hand, the pulse intensity and the pulse duration is selected so small that only the irradiated strip 14 in the focus of the cylindric lens 17 is heated to the temperature necessary for the melting and alloying, whereas the remaining parts of the layer 15, through heat flow of the strip 14, are not heated to the alloying temperature. These conditions have been fulfilled, in the example, by a laser beam pulse with a pulse energy of 40 joule and a pulse duration of 40 ns, in which the beam diameter amounted to 5 mm and the focal length of the cylindric lens amounted to 40 mm. The fact that the strip 14 was alloyed can easily be seen by a color change.

The choice of a short pulse duration of a fraction of a microsecond (preferably a few 10 ns) prevents not only alloying of those parts of the metal layer 15 which adjoin the strip 14, but also leads to an exceptionally thin transitional zone 7, i.e. a small depth of penetration of the alloy constituents and only a superficial heating of the p-layer. Whereas the alloying constituents will, in an alloying furnace, diffuse over 1 micrometer deep into the semiconductor layer, after alloying using a laser beam pulse of 40 ns duration a depth of diffusion of less than 100 nm was measured. This slight depth of penetration is advantageous because the p-layer of the diode can accordingly be selected to be extremely thin, without the risk of a diffusion of alloying constituents into the active (p-n) zone of the diode. However, the thinner the p-layer can be selected, the better is the heat transfer (or flow-off) from the active zone of the diode, which is of crucial significances for the continuous-wave operation of the diode.

Finally, the entire metal layer is alloyed on the n-side of the platelet 13 which is similarly effected with a "q-Switch"-Nd:YAG laser, in which, preferably similarly, a short pulse duration of a fraction of a microsecond is selected, but the entire surface, or successive mutually-adjoining partial surfaces are irradiated. The n-contact layer may also be deposited by evaporation prior to the application of the p-contact layer and be alloyed in the conventional manner.

In a modification of the method, after the alloying, a further layer of gold is deposited by evaporation, by electrolytic deposition or by sputtering onto the layer 15, whereby the contact layer described in connection with FIG. 2 is obtained.

The layer 15 may also be etched with an etching solution which attacks its non-alloyed parts more severely than the alloyed strip 14. This solution may be, for example (for gold) a saturated solution of KCN in water. With a suitably-selected etching duration, a smooth flat surface is obtained on the layer 15. After longer etching (possibly with different etching agents), the strip 14 protrudes in step-like manner above the adjoining non-alloyed layer parts, in which case these may, if desired, also be completely etched away, so that only the strip 14 remains on the p-layer. Also, additionally a part of the semiconductor layer or layers not covered by the strip 14 may be etched away.

The invention is not restricted either to laser diodes or to the contacting of a strip-shaped part of a semiconductor surface, but can be applied to any desired semiconductor devices in which a partial region of a semiconductor surface is to be contacted. For example, the semiconductor device may be an integrated circuit having a plurality of diodes, transistors or the like. For the contacting of the semiconductor substrate, a metallic layer, applied to the entire substrate surface, may be allowed in a partial region, i.e. in various surface parts of the desired shape, in each case for one diode, one transistor or the like, with the substrate. For this, instead of the cylindric lens 17 in FIG. 3, use may also be made of a hologram which focuses the laser beam pulse onto the various surface parts of the desired shape. Equally, diaphragms (or shutters) or masks may be used which allow the laser beam pulse through only onto the desired surface parts.

The partial region of the semiconductor surface may be alloyed, instead of by a laser beam pulse, but by relative movement with regard to a continuous laser beam which is focused, for example, by a spherical lens.

To reduce temperature gradients, the semiconductor substrate with the contact layer may be heated (possibly in a protective gas atmosphere), prior to and during irradiation, to a temperature which is less than the temperature which is necessary for the alloying of the contact layer with the semiconductor substrate. In this event, of course, the intensity of the laser beam must be correspondingly smaller.

The terms and expressions which have been employed herein are used as terms of description and not of limitation, and there is no intention, in the use of such terms and expressions of excluding any equivalents of the features shown and described or portions thereof, but it is recognized that various modifications are possible within the scope of the invention claimed.

We claim:

1. A semiconductor device comprising, a plurality of semiconductive layers having an outer semiconductive layer, and a contact layer consisting of one or more metal or semiconductor materials uniformly and entirely covering said outer semiconductive layer and having over its entire surface the same material composition and abutting over its entire surface directly against said outer semiconductive layer but having only on a partial region of its surface a conductive transition to said outer semiconductive layer, said partial region being only a fraction of the entire surface of said contact layer and said conductive transition being obtained by alloying said partial region by means of a focused laser beam pulse heating only said partial region of the contact layer to the alloying temperature of said one or more metals or semiconductor materials, whereby alloy constituents of the melted contact material wetting said outer semiconductive layer diffuse only in a superficial zone of said outer semiconductive layer.

2. A semiconductor device as claimed in claim 1 in which said contact layer is a metallic layer.

3. A semiconductor device as claimed in claim 2, in which said contact layer which is alloyed in the partial region is coated with a second, metallic layer.

4. A semiconductor device as claimed in claim 2 in which the metallic layer contains gold as the main constituent.

5. A semiconductor device as claimed in claim 3, which is designed as a laser diode, in which the one of the two contact layers covering the surfaces of the p- and n- side of the diode is alloyed only in the region of a strip with the semiconductor substrate.

* * * * *